(12) United States Patent
Pavier et al.

(10) Patent No.: US 7,034,344 B2
(45) Date of Patent: Apr. 25, 2006

(54) INTEGRATED SEMICONDUCTOR POWER DEVICE FOR MULTIPLE BATTERY SYSTEMS

(75) Inventors: Mark Pavier, West Sussex (GB); Tim Sammon, East Sussex (GB); Chris Davis, Newbury Park, CA (US)

(73) Assignee: International Rectifier Corporation, El Segundo, CA (US)

( * ) Notice: Subject to any disclaimer, the term of this patent is extended or adjusted under 35 U.S.C. 154(b) by 18 days.

(21) Appl. No.: 10/888,410

(22) Filed: Jul. 8, 2004

(65) Prior Publication Data

US 2005/0006750 A1  Jan. 13, 2005

Related U.S. Application Data

(60) Provisional application No. 60/485,672, filed on Jul. 8, 2003.

(51) Int. Cl.
*H01L 27/02* (2006.01)
(52) U.S. Cl. .................. 257/135; 257/330; 257/778
(58) Field of Classification Search ................ 257/135, 257/691
See application file for complete search history.

(56) References Cited

U.S. PATENT DOCUMENTS

| | | | |
|---|---|---|---|
| 5,341,003 A * | 8/1994 | Obinata ....................... 257/135 |
| 6,653,740 B1 * | 11/2003 | Kinzer et al. ................ 257/778 |
| 2005/0029588 A1 * | 2/2005 | Sakamoto et al. .......... 257/330 |

* cited by examiner

*Primary Examiner*—David Nelms
*Assistant Examiner*—Dao H. Nguyen
(74) *Attorney, Agent, or Firm*—Ostrolenk, Faber, Gerb & Soffen, LLP

(57) ABSTRACT

An integrated semiconductor device which includes a plurality of power semiconductor devices formed in a common semiconductor die.

9 Claims, 2 Drawing Sheets

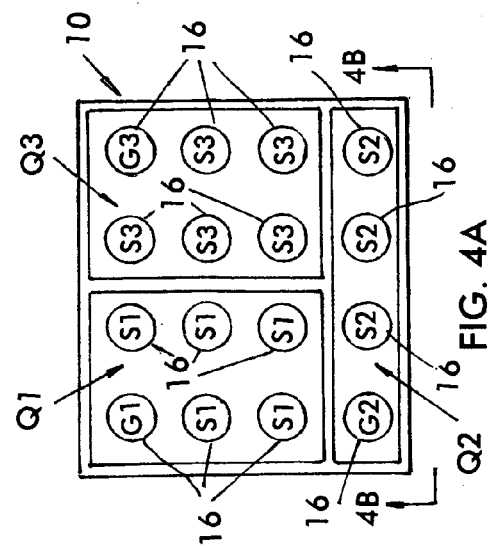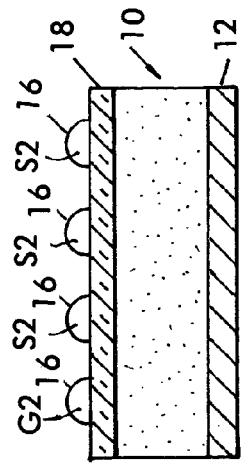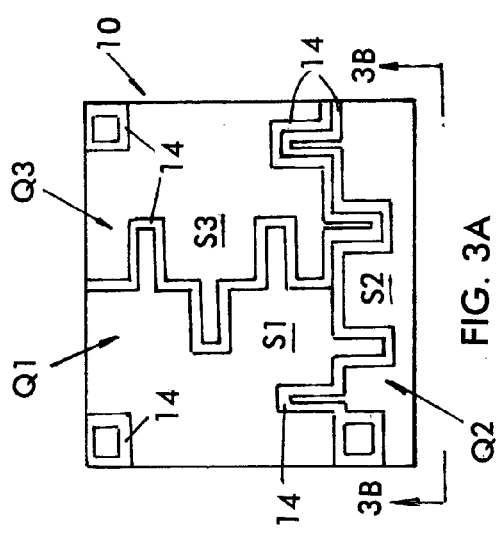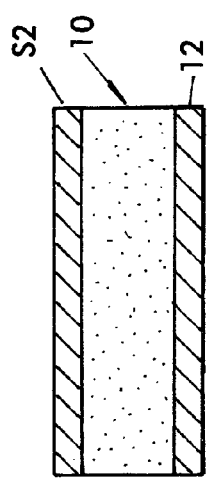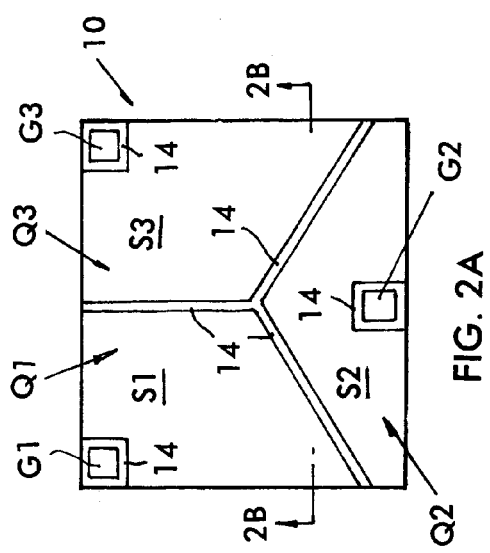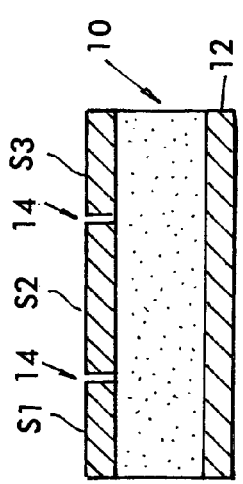

INTEGRATED SEMICONDUCTOR POWER DEVICE FOR MULTIPLE BATTERY SYSTEMS

RELATED APPLICATION

The application is based on and claims benefit of U.S. Provisional Application No. 60/485,672, filed on Jul. 8, 2003, entitled Power MOSFET for Multiple Battery Systems, to which a claim of priority is hereby made and the subject matter of which is incorporated by reference.

FIELD OF THE INVENTION

This invention relates to MOSFET devices and more specifically relates to a MOSFET structure adapted for use in a dual or multiple battery system.

BACKGROUND OF THE INVENTION

Laptop computers, personal digital assistants (PDAs), cell phones and other portable equipment often use additional battery packs to extend equipment "on" and "standby" times. Management of charge flow between the battery pack, load, external charger and additional add on battery packs often require sophisticated battery management circuitry. An example of such a circuit is shown in U.S. Pat. No. 5,764,032 to Moore.

FIG. 1 shows a circuit similar to the one shown by U.S. Pat. No. 5,764,032. The circuit shown by FIG. 1 contains 6 P-channel power MOSFETs Q1,Q2,Q3,Q4,Q5,Q6. Power MOSFETs Q1,Q2,Q3,Q4,Q5,Q6 are all driven by control IC 20. That is, control IC 20 provides signals to the gate of each of the power MOSFETs Q1,Q2,Q3,Q4,Q5,Q6 in order to cause each to conduct electricity.

The circuit of FIG. 1 is symmetric and can be understood by considering one side only. Specifically, low side MOSFET Q1 works in conjunction with MOSFET Q2 as a charge control device, limiting the flow of charge from the charge input to battery A when overcharge conditions are detected by control IC 20. MOSFET Q2 prevents charge flowing from battery B into battery A. MOSFET Q1 is a discharge control device that, when required, limits current flow between battery A and the load. This may occur during load short circuit conditions, or when the battery minimum cut-off voltage has been detected.

A circuit such as the one shown by FIG. 1 would require three discreet MOSFETs, which are connected in a common drain fashion. Such a configuration results in losses, which is undesirable particularly in portable, battery operated devices in which efficiency is an important parameter.

BRIEF SUMMARY OF THE INVENTION

In a device according to the present invention, a plurality of power semiconductor devices, e.g. power MOSFETs, are formed in a common semiconductor die, which may be a silicon die. In the preferred embodiment, each power device includes a first power electrode, e.g. a source electrode, and a control electrode, e.g. gate electrode, disposed on one major surface of the semiconductor die, and a second power electrode, e.g. drain electrode, disposed on a second major surface of the semiconductor die opposite to the first major surface.

According to one aspect of the present invention, all power devices share a common electrode. Thus, in the preferred embodiment, the power MOSFETs share a common drain electrode, which reduces the overall losses compared to an arrangement in which three discreet MOSFETs are used.

In one embodiment of the present invention, the first power electrodes (e.g. source electrodes) are devised to cover equal portions of the first major surface of the semiconductor die. That is, each first power electrode is connected to an equal number of active cells. As a result, all power devices exhibit the same characteristics.

In another embodiment of the present invention, each first power electrode (e.g. source electrodes) may be sized in accordance with the function of the semiconductor device. Thus, for example, the source electrode of the power MOSFET in the discharge path may be sized to lower the resistance of the device (for example by covering a greater number of active cells) compared to the MOSFET in the charging path.

BRIEF DESCRIPTION OF THE DRAWINGS

FIG. 1 is a circuit diagram of a multiple battery system.

FIG. 2A shows a top plan view of an integrated semiconductor device according to the first embodiment of the present invention.

FIG. 2B shows a cross-sectional view of an integrated semiconductor device according to the second embodiment of the present invention along line 2B—2B in FIG. 2A viewed in the direction of the arrows.

FIG. 3A shows a top plan view of an integrated semiconductor device according to the second embodiment of the present invention.

FIG. 3B shows a side plan view of an integrated semiconductor device according to the second embodiment viewed in the direction of arrows 3B—3B in FIG. 3A.

FIG. 4A shows a top plan view of an integrated semiconductor device according to the third embodiment of the present invention.

FIG. 4B shows a side plan view of an integrated semiconductor device according to the third embodiment viewed in the direction of the arrows 4B—4B in FIG. 4A.

DETAILED DESCRIPTION OF THE PREFERRED EMBODIMENT

Figure 7:
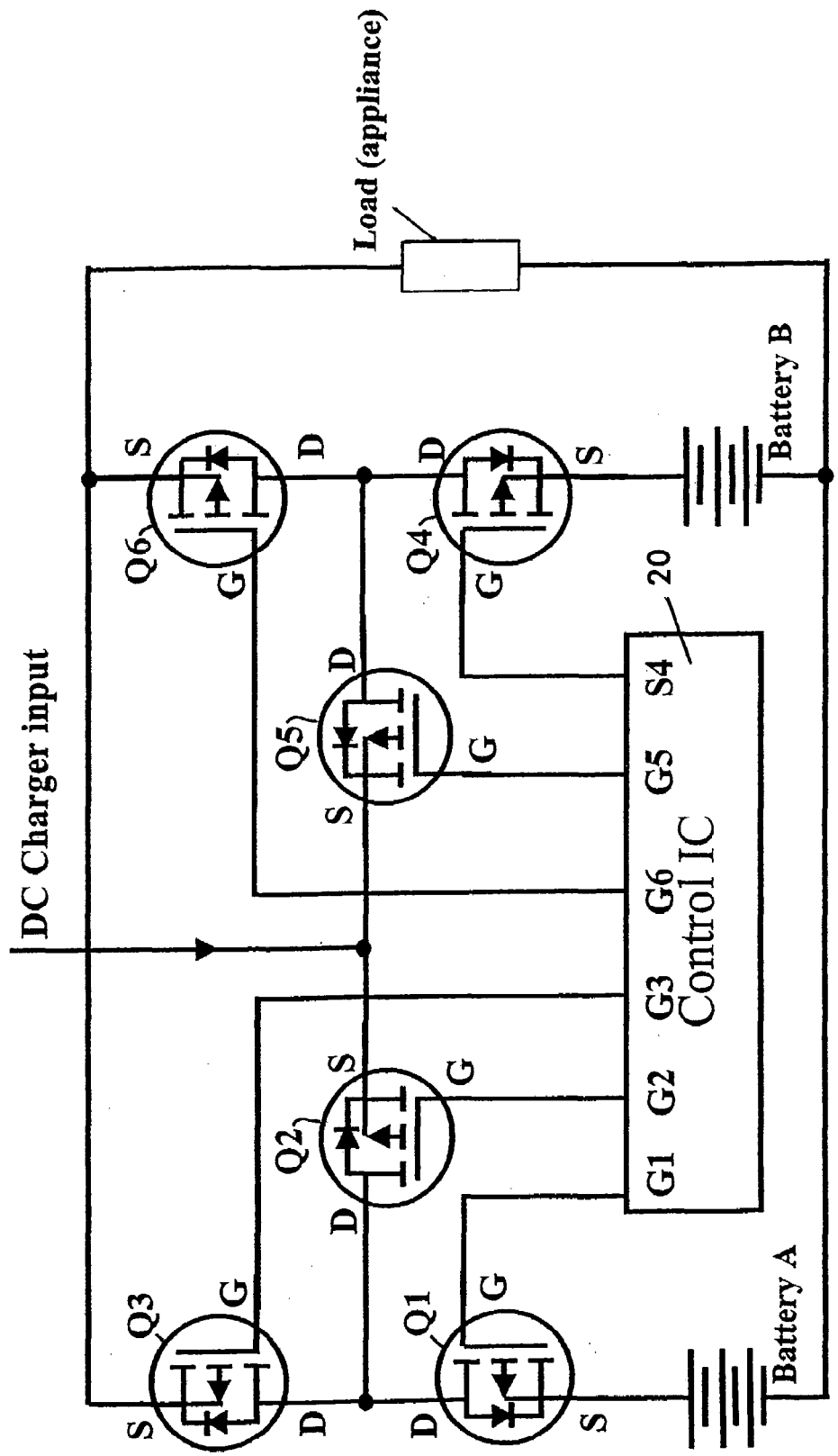

Referring now to FIGS. 2A and 2B, an integrated semiconductor device according to the first embodiment of the present invention includes, a plurality of independently operating semiconductor devices Q1, Q2, Q3 formed in a common semiconductor die 10. That is, each semiconductor device Q1,Q2,Q3 is capable of being operated independent of the others.

According to an aspect of the present invention, each semiconductor device Q1,Q2,Q3 includes a first power electrode S1,S2,S3, a control electrode G1, G2, G3, and a second electrode 12. First power electrodes S1,S2,S3 and control electrodes G1,G2,G3 are disposed on one major surface of semiconductor die 10, while second power electrode 12 is disposed on a second major surface of semiconductor die 10, the second major surface being opposite to the first major surface. Thus, in the preferred embodiment of the present invention, second power electrode 12 is common to all semiconductor devices Q1,Q2,Q3. That is, power may be conducted between first power electrodes S1,S2,S3 and second power electrode 12 upon application of an appropriate control signal to one or more of control electrodes G1,G2,G3.

In the preferred embodiment of the present invention, semiconductor devices Q1,Q2,Q3 are P-channel power MOSFETs formed in a silicon die. Thus, first power electrodes S1,S2,S3 are source electrodes connected to source regions (not shown) of active cells in semiconductor die 10, second power electrode 12 is a drain electrode connected to a common drain region (not shown) and control electrodes G1,G2,G3 are gate electrodes. Having a common second power electrode such as a common drain electrode advantageously reduces substrate conduction losses compared to an arrangement in which three discreet power devices are connected in a common drain fashion.

In the preferred embodiment of the present invention, a gap 14 may be provided to isolate first power electrodes S1,S2,S3 from one another. Also, a gap 14 may be provided to isolate control electrodes G1,G2,G3 from the surrounding first power electrode S1,S2,S3 respectively. Gaps 14 may be filled with a dielectric material in order to improve the electrical isolation of first power electrodes S1,S2,S3 from one another and from control electrodes G1,G2,G3.

In the first embodiment of the present invention, first power electrodes S1,S2,S3 are sized such that each covers an equal portion of the first major surface of semiconductor body 10. That is, each first power electrode is connected to an equal number of active cells. Thus, each power device Q1, Q2, Q3 exhibits the same characteristics as the other two devices.

Referring now to FIGS. 3A and 3B, in which like numerals identify like features, a semiconductor device according to the second embodiment of the present invention includes first power electrodes S1,S2,S3 which differ in size. That is, in a device according to the second embodiment, first power electrodes S1,S2,S3 are not sized to cover equal portions of the first major surface of semiconductor die 10. Rather, each first power electrode S1,S2,S3 may be sized to achieve a desired device characteristic. Thus, for example, the size of S1,S2,S3 may be devised to correspond to the number of active cells. As a result, the resistance of a semiconductor device Q1,Q2,Q3 while operating (usually referred to as Rdson) may be devised to correspond to the size of a first power electrode. For example, first power electrodes S2 may have a smaller size and thus be connected to fewer active cells. As a result, semiconductor device Q2 may have a higher Rdson compared to the remaining semiconductor devices Q1,Q3. Thus, for example, an integrated semiconductor device according to the present invention may be devised such that a MOSFET in the discharge path may have a lower $R_{DSON}$ than those in the charge path.

First power electrodes S1,S2,S3 and control electrodes G1,G2,G3 in a semiconductor device according to the first embodiment and a semiconductor device according to the second embodiment are preferably adapted to receive wire-bonding, and second power electrode 12 is preferably adapted to be soldered down to a conductive surface, such as a conductive pad in a conventional package.

Referring now to FIGS. 4A and 4B, a device according to the third embodiment of the present invention may be adapted for flip-chip type mounting. A flip-chip type device, such as flip-chip type power MOSFET, is prepared to have its top electrodes mounted onto conductive pads of, for example, a circuit board. Thus, in a flip-chip type power MOSFET the source electrode and the gate electrode are prepare for electrical connection and mounting to a conductive pad, e.g. a conductive pad on a circuit board.

A semiconductor device according to the third embodiment of the present invention includes solder balls 16 which are connected through a passivation layer 18 to respective electrodes below. Thus, solder balls 16 are provided that are connected to first power electrodes S1,S2,S3, and control electrodes G1,G2,G3. More detail regarding a method for forming bump contacts on an electrode of a semiconductor device may be found in copending application Ser. No. 09/780,080, filed Feb. 9, 2001, entitled VERTICAL CONDUCTION FLIP-CHIP DEVICE WITH BUMP CONTACTS ON SINGLE SURFACE, in the names of Daniel M. Kinzer, Aram Arzumanyan and Tim Sammon and assigned to the assignee of the present invention the subject matter of which is incorporated herein by reference.

In an alternative embodiment, an external connection to the second power electrode (e.g. drain electrode) may be brought to the first major surface of semiconductor body 10 and adapted for flip-chip type mounting. Such an external connection may be used for current sensing, application Ser. No. 09/780,080 shows a method for devising a device in which second power electrode is disposed on the same major surface as the first power electrode in order to allow for flip-chip type mounting. The concept disclosed in application Ser. No. 09/780,080 may be employed to provide an external connection to the common drain of an integrated device according to the preferred embodiment of the present invention.

An integrated semiconductor device according to the present invention may be separately packaged or copacked with an identical second device if desired. Furthermore, while the embodiments shown herein include three MOSFETs in a common semiconductor die, it will be apparent that fewer or more devices with a common electrode, such as a common drain electrode, could be devised without deviating from the principles of the present invention.

It should be apparent that an integrated semiconductor device according to the present invention is not limited to systems in which two battery packs are used, but may also be used in circuits containing three or more battery packs, in which case one additional integrated semiconductor device according to the present invention may be required for every additional battery pack.

Also, it should be noted that the circuit shown in FIG. 1 requires P-channel power MOSFETs. One skilled in the art would, however, recognize that N-channel MOSFETs may be formed in a common semiconductor die without deviating from the principle and the spirit of the present invention.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. An integrated semiconductor device comprising:
   a semiconductor die having a charging path and a discharging path; and
   three independently operable semiconductor devices formed in said die at least one of which is in said charging path and at least another one of which is in said discharging path, each said device including
   a first power electrode,
   a control electrode, and
   a second power electrode;
   wherein said first power electrode and said control electrode of each die is disposed on a first major surface of said semiconductor die, and said second power electrode is disposed on a second opposing major surface of said semiconductor die and is common to all said devices, and wherein said at least one device in said charging path is configured to have a different on resistance than that of said at least another device.

2. A semiconductor device according to claim 1, wherein said first power electrode is a source electrode, said control electrode is a gate electrode, and said second power electrode is a drain electrode.

3. A semiconductor device according to claim 1, wherein said first power electrode is adapted for flip-chip mounting.

4. A semiconductor device according to claim 1, wherein said first power electrode includes solder bumps for flip-chip mounting.

5. A semiconductor device according to claim 1, wherein there are three power MOSFETs formed in said semiconductor die.

6. An integrated semiconductor device comprising:
   a silicon die having a charging path and a discharging path; and
   a plurality of independently operable power MOSFETs formed in said silicon die at least one of said MOSFETs being in said charging path and at least another one of said MOSFETs being in said discharging path, each said power MOSFET including
   a source electrode,
   a gate electrode, and
   a drain electrode;
   wherein said source electrode and said gate electrode of each die is disposed on a first major surface of said silicon die, and said drain electrode is disposed on a second opposing major surface of said silicon die and common to all said MOSFETs wherein said MOSFET in said charging path has an on resistance that is different from that of said MOSFET in said discharging path.

7. A semiconductor device according to claim 6, wherein said source electrode is adapted for flip-chip mounting.

8. A semiconductor device according to claim 6, wherein said source electrode includes solder bumps for flip-chip mounting.

9. A semiconductor device according to claim 6, wherein there are three power MOSFETs formed in said silicon die.

* * * * *